(12) United States Patent
Teraoka et al.

(10) Patent No.: US 9,981,332 B2
(45) Date of Patent: May 29, 2018

(54) HOLDING STAND

(71) Applicant: Hakko Corporation, Osaka (JP)

(72) Inventors: Yoshitomo Teraoka, Osaka (JP); Hisao Nemoto, Osaka (JP)

(73) Assignee: Hakko Corp, Osaka (JP)

( * ) Notice: Subject to any disclaimer, the term of this patent is extended or adjusted under 35 U.S.C. 154(b) by 58 days.

(21) Appl. No.: 15/262,410

(22) Filed: Sep. 12, 2016

(65) Prior Publication Data

US 2017/0182576 A1    Jun. 29, 2017

(30) Foreign Application Priority Data

Dec. 25, 2015 (JP) ................. 2015-254399

(51) Int. Cl.
| | |
|---|---|
| *F21V 29/00* | (2015.01) |
| *B23K 3/02* | (2006.01) |
| *F16M 11/04* | (2006.01) |
| *F16M 11/08* | (2006.01) |
| *F16M 11/18* | (2006.01) |
| *F16M 11/20* | (2006.01) |
| *F16M 11/10* | (2006.01) |
| *F16M 11/24* | (2006.01) |
| *B23K 101/42* | (2006.01) |
| *H05K 3/34* | (2006.01) |

(52) U.S. Cl.
CPC ........... *B23K 3/027* (2013.01); *F16M 11/041* (2013.01); *F16M 11/046* (2013.01); *F16M 11/08* (2013.01); *F16M 11/10* (2013.01); *F16M 11/18* (2013.01); *F16M 11/2014* (2013.01); *F16M 11/2092* (2013.01); *F16M 11/24* (2013.01); *B23K 2201/42* (2013.01); *H05K 3/3494* (2013.01); *H05K 2203/0165* (2013.01); *H05K 2203/081* (2013.01)

(58) Field of Classification Search
CPC ...................................... Y10T 83/773
USPC ............ 248/637, 651, 660, 661; 269/55, 71
See application file for complete search history.

(56) References Cited

U.S. PATENT DOCUMENTS

| | | | | |
|---|---|---|---|---|
| 4,326,694 | A * | 4/1982 | Destree | B25D 17/28 211/182 |
| 5,547,330 | A * | 8/1996 | Walimaa | F16M 11/043 269/71 |
| 5,718,408 | A * | 2/1998 | Lin | B23Q 1/25 248/646 |
| 7,051,607 | B2 * | 5/2006 | Wekluk | F16M 11/046 73/866.5 |
| 8,998,281 | B2 * | 4/2015 | Li | B23Q 3/18 294/113 |
| 2017/0154865 | A1 * | 6/2017 | Sato | H05K 13/0413 |

* cited by examiner

*Primary Examiner* — Steven M Marsh
(74) *Attorney, Agent, or Firm* — David B Abel

(57) ABSTRACT

A holding stand for a heating tool such as a soldering or de-soldering device. The holding stand has a rotary member for securing the heating tool and an assembly for moving and positioning the rotary member with the heating tool in any of three axis.

15 Claims, 11 Drawing Sheets

HOLDING STAND

BACKGROUND OF THE INVENTION AND RELATED ART

A holding stand is used to hold a heating tool. Conventional holding stands may allow that movement of a heating tool along three axes (X-axis, Y-axis or Z-axis). The heating tool needs sliding mechanisms along the X-axis and the Y-axis to move a heating tool across a horizontal work surface. Accordingly the conventional holding stands are substantially larger than the work surface area that they can cover.

SUMMARY OF THE INVENTION

A purpose of the present invention is to provide a holding stand for a heating device, such as a soldering device or a hot air blower for de-soldering functions, which does not require a large occupancy area. The holding stand has a rotary member for securing the heating tool and an assembly for moving and positioning the rotary member with the heating tool in any of three axis.

DETAILED DESCRIPTION OF THE INVENTION

Figure 1:
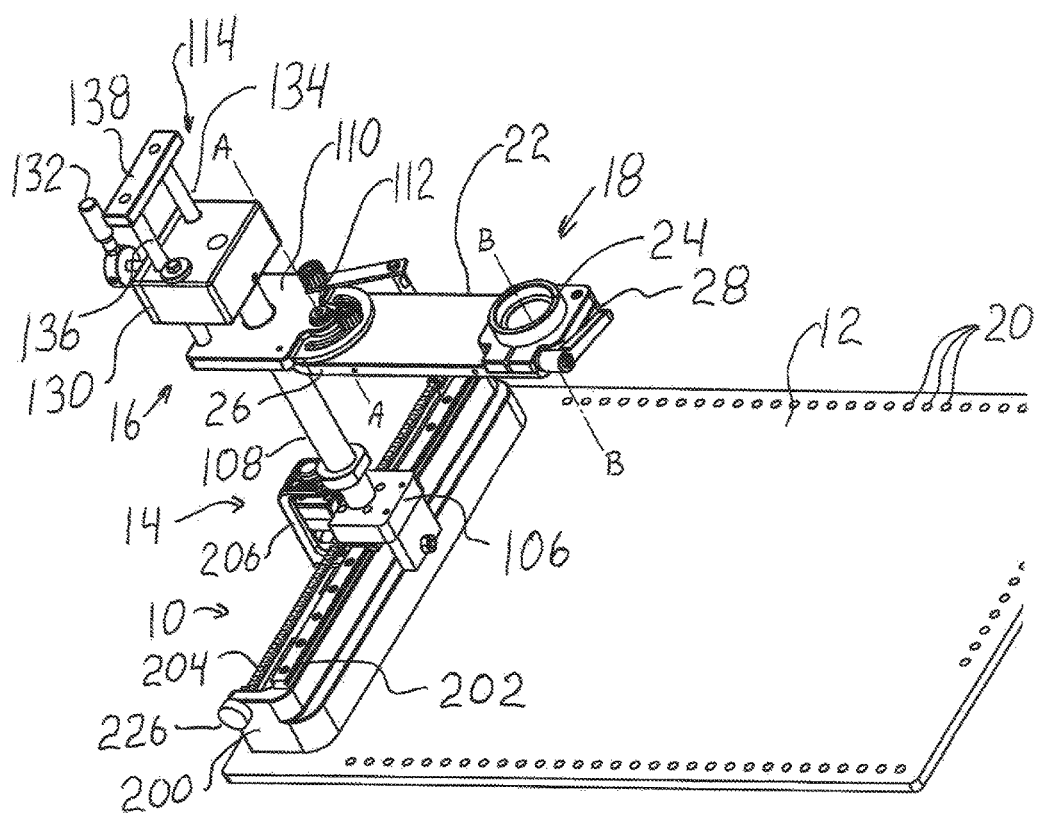
FIG. 1 is a perspective view of a holding stand of the present invention.

FIG. 1 is a perspective view showing a holding stand 10 of the present invention. The holding stand 10 of this invention can occupy a small area proximate a work surface and effectively cover the entire work surface. The holding stand 10 has a support plate 12, a first sliding member 14, a second sliding member 16 and a rotary member 18. The holding stand 10 is configured so that a user may place a substrate or work item such as a printed circuit board for electronic components (not shown) on the support plate 12. The support plate 12 may have several substrate fixture holes 20 that may be used to mount a fixture device (not shown) that securely positions a substrate or work item such as for example a printed circuit board in place.

Figure 2:
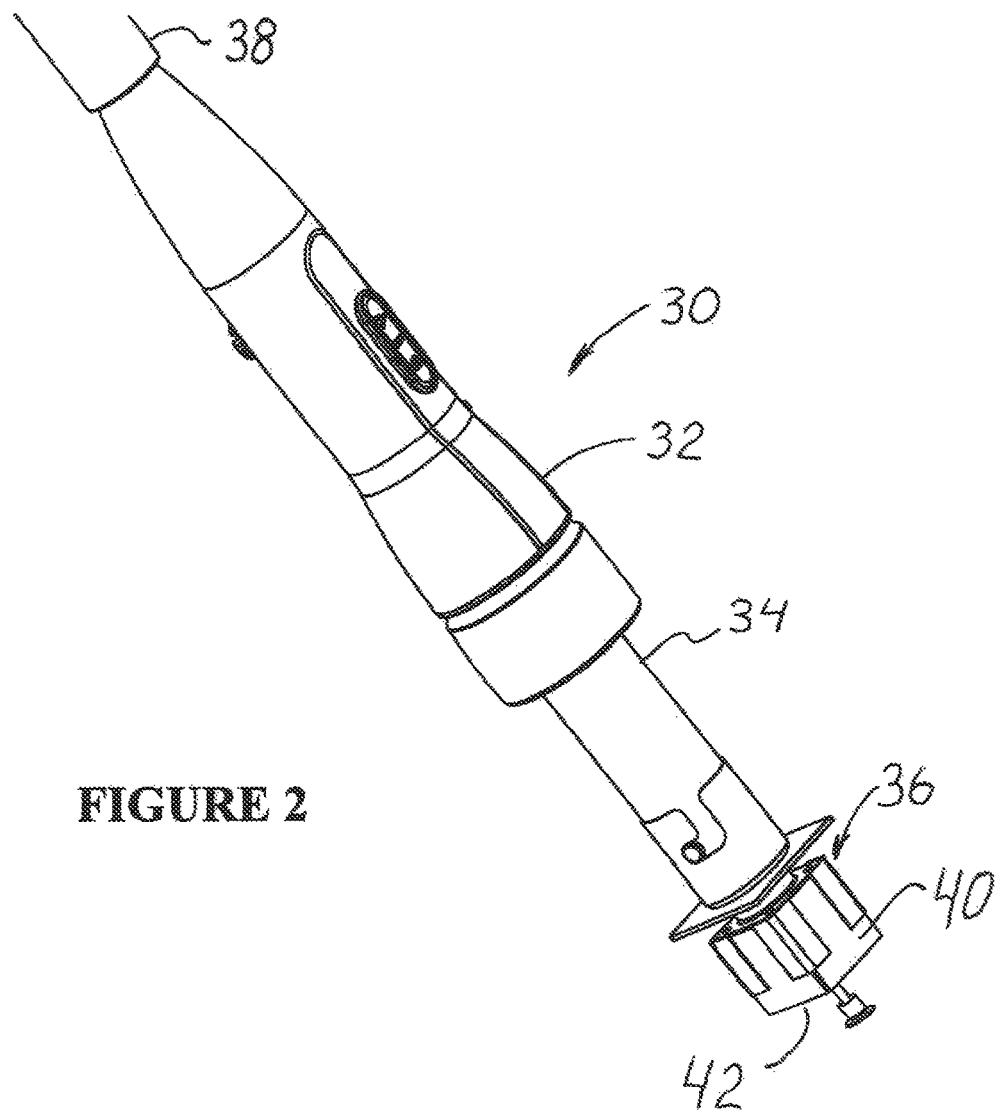
FIG. 2 is a perspective view of an exemplary hand-held heating device that may be used with the holding stand of the present invention.

The first sliding member 14 is fixed on the support plate 12, and the second sliding member 16 is fixed on the first sliding member 14. The first sliding member 14 allows the movement of the second sliding member 16 along the Y-axis. The rotary member 18 is fixed on the second sliding member 16 and is configured to hold a heating tool, such as the hot air blower 30 as depicted in FIG. 2. Alternatively the heating tool may be a de-soldering tool or other tools that may be used to apply thermal energy. The second sliding member 16 allows the movement of the rotary member 18 along the Z-axis.

The rotary member 18 includes an arm plate 22 and a tool holder, such as a bearing 24. The arm plate 22 has a base end 26 and a distal end 28 and it is preferably formed as a single flat metal piece. The axis of rotation A crosses the base end 26 of the arm plate 22. The arm plate 22 is connected with the second sliding member 16 at the base end 26. The heating tool is inserted into the bearing 24 located at the distal end 28. The arm plate 22 turns around the axis of rotation A so that the heating tool can move along an arcuate path. The turning of the arm plate 22 allows for the heating tool moving along the X-axis. The user can position the heating tool along the X-axis by turning the arm plate 22. The movement along the axis of rotation A of the arm plate 22 can move the heating tool along the Y-axis. Also, the user can position the heating tool along the Y-axis by using the first sliding member 14. The user positions the heating tool along the Z-axis by using the second sliding member 16. The user can adjust the holding position within three-dimensional space. An axis of rotation B is a central axis of the bearing 24. The bearing 24 allows the movement of the heating tool along the axis of rotation B. The distance between the axis of rotation A and the axis rotation B may depend on the size of the support plate 12. If the holding stand 10 is large and has a large support plate 12, the distance may be longer. If the holding stand 10 is small, the distance may be shorter. Alternatively the bearing 24 may be positioned at the midpoint between the base end 26 and the distal end 28 of the arm plate 22.

The user may attach various heating tools such as a hot air blower 30 on the holding stand 10. FIG. 2 shows the hot air blower 30. The hot air blower 30 has a grip member 32, a heater body 34, a nozzle 36 and a cable 38. The heater body 34 makes hot air by power supplied through the cable 38. The hot air is blown out through the nozzle 36. The nozzle 36 has side walls 40 configured to abut the surface of the work item around an electronic component (not shown). The side walls 40 have a distal edge 42 forming an opening. The user may attach the hot air blower 30 to the bearing 24 with the distal edge 42 of the side walls 40 opposite to the support plate 12. The user can adjust the position of the nozzle 36 of the hot air blower 30 to fit around the edges of an electronic component by turning the hot air blower 30 and its nozzle 36 along axis of rotation B. The nozzle 36 is brought closer to the support plate 12 by the second sliding member 16. The electronic component may thus enclosed or surrounded by the nozzle 36 and heated by the hot air blower 30 to melt solder securing the electronic component to the work item. The user can then easily remove the electronic component from the work item.

Figure 3:
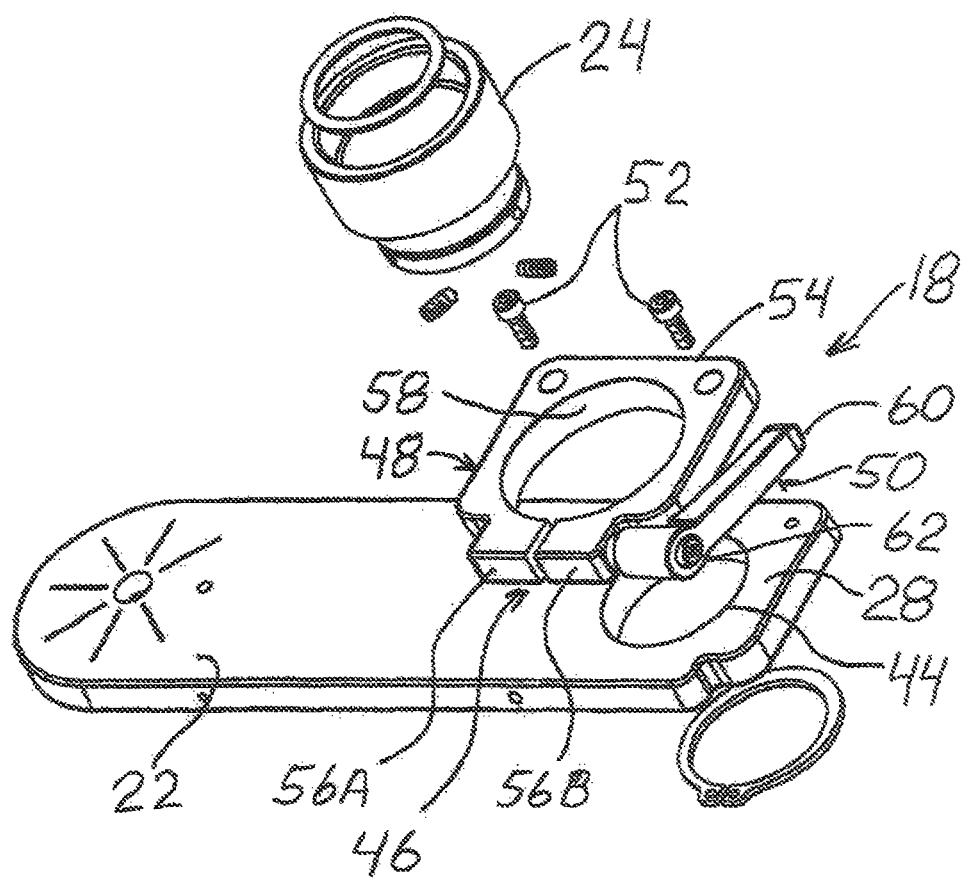
FIG. 3 is an exploded perspective view of the rotary member of the holding stand of the present invention.

FIG. 3 depicts an exploded perspective view of the components of the rotary member 18. The distal end 28 of the arm plate 22 has an orifice or through-hole 44. The bearing 24 is inserted into the through-hole 44. The rotary member 18 has a lock mechanism 46. The lock mechanism 46 fixes the rotation of the bearing 24 and holds the heating tool such as the hot air blower 30 in cooperation with the bearing 24.

The lock mechanism 46 has a ring piece 48, an operation lever 50, and two fixation elements such as screws 52. The bearing 24 is surrounded by the ring piece 48. When the user turns the operation lever 50 clockwise the ring piece 48 fastens to the bearing 24 and the ring piece 48 locks the rotation of the bearing 24. When the user turns the operation lever counterclockwise, the ring piece 48 loosens the bearing 24. The ring piece 48 has a fastening plate 54 and projecting pieces 56A and 56B. The fastening plate 54 is fixed to the arm plate 22 by screws 52. The fastening plate 54 has a locking surface 58 which abuts the bearing 24. The locking surface 58 locks the rotation of the bearing 24 by pressing the bearing 24.

There is small space between the projecting piece 56A and projecting piece 56B. The operation lever 50 is L-shaped. The operation lever 50 has an operation arm 60 and a connecting rod 62. The connection rod 62 penetrates through openings in the projecting pieces 56A and 56B. A distal end (not shown) of the connection rod 62 has male threads and the inside of the through opening in the projecting piece 56A has an internal female thread. When the connection rod 62 is turned clockwise, the distance between the projecting piece 56A and projecting piece 56B shrinks and the bearing 24 may be locked by the ring piece 48. When the connection rod 62 is turned counterclockwise, the distance between the projecting piece 56A and projecting piece 56B becomes larger and thereby the through-hole 44 will be larger, and the bearing 24 can turn smoothly.

Figure 4:
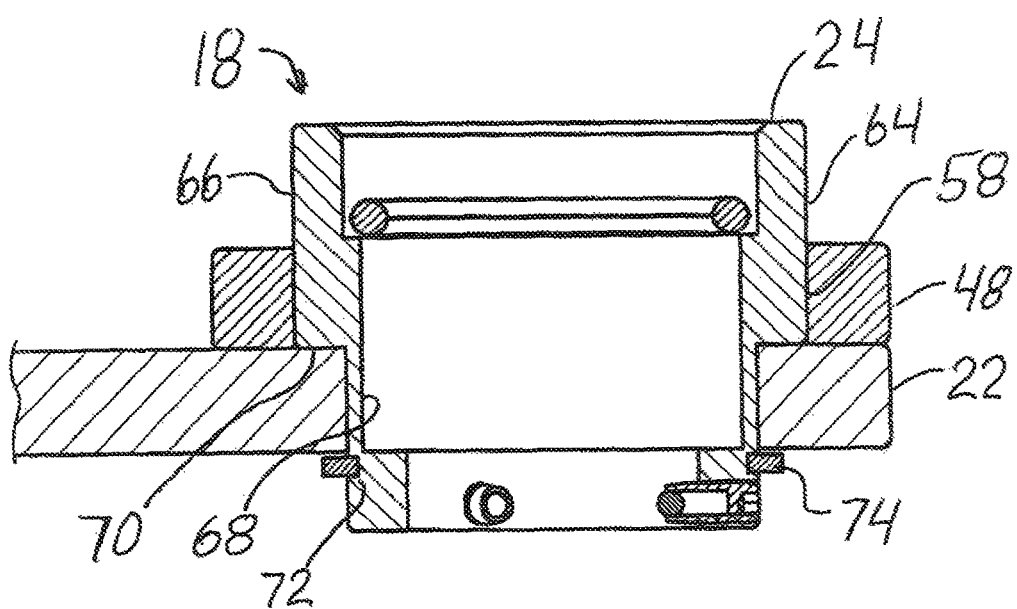
FIG. 4 is a side cross sectional view of the rotary member of the holding stand of the present invention.

The rotary member 18 and the bearing 24 may have components having various shapes and sizes. The configuration depicted in FIG. 4 is an exemplary cross-sectional drawing of the rotary member 18. An outer peripheral surface 64 of the bearing 24 slides against the arm plate 22 and the ring piece 48. The outer peripheral surface 64 includes a first outer peripheral surface diameter 66, a second outer peripheral surface diameter 68 and a shoulder surface 70. The first outer peripheral surface diameter 66 is larger than the second outer peripheral surface diameter 68. The first outer peripheral surface diameter 66 is larger than the diameter of the through-hole 44. The first outer peripheral surface diameter 66 is sized to fit in the diameter of the through-hole 44 in the unlocked configuration of the fastening plate 54. The shoulder surface 70 abuts the upper surface of the arm plate 22, preventing the bearing 24 from falling through the through-hole 44.

When the user turns the operation arm 60 of the operation lever 50 clockwise, the locking surface 58 of the ring piece 48 presses inward against the first outer peripheral surface diameter 66 of the bearing 24, and the resulting large frictional force locks the bearing 24 in place. A portion of the rotary member 18 projecting below the fastening plate 54 may include a circumferential groove 72 to accept a snap ring 74. The snap ring 74 is inserted into the groove 72 after the insertion of the bearing 24 so that the bearing 24 cannot be inadvertently detached upwardly.

Figure 5:
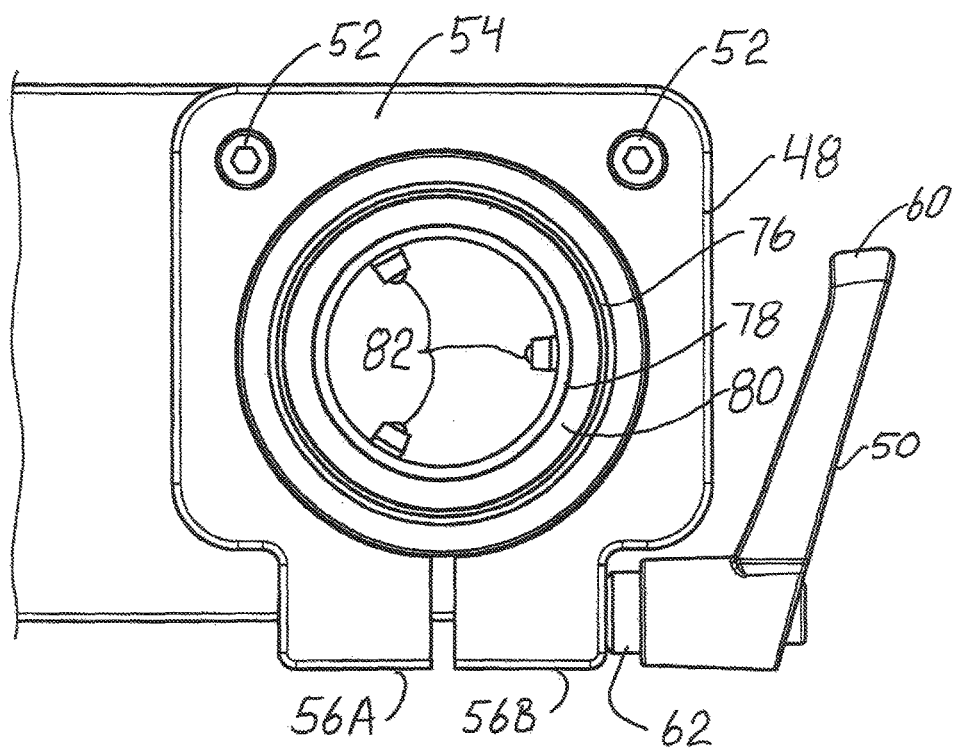
FIG. 5 is a top view of the rotary member of the holding stand of the present invention.

The heating tool may be affixed into the bearing 24 in any number of various configurations and alternative fixing means. FIG. 5 is provided to illustrate one apparatus for affixing a heating tool into the bearing 24, as an example. FIG. 5 is a top view of the rotary member 18 of the holding stand 10 of the present invention depicting as well the top side of the fastening plate 54. As illustrated in FIG. 5, the inner surface of bearing 24 may have a first shoulder surface 76 and a second shoulder surface 78. The rotary member 18 preferably has an O-ring 80 set onto the first shoulder surface 76. As depicted in FIG. 2, the hot air blower 30 has a section of the heater body 34 that has a diameter that is less than the outer diameter of the grip member 32, defining step or shoulder at the transition from the heater body 34 to the grip member 32. In operation, the user may insert the nozzle 36 end of the hot air blower 30 into the axial passageway through the bearing 24, until the step defined at the transition from the heater body 34 to the grip member 32 of the hot air blower 30 contacts the second shoulder surface 78. As also depicted in FIG. 5, the rotary member 18 may have at least one and preferably three set screws 82 projecting inwardly from the inner surface of the rotary member 18. The user adjusts the projection amount of the set screws 82 after the hot air blower 30 is inserted so that the step defined at the transition from the heater body 34 to the grip member 32 of the heating tool abuts against the second shoulder surface 78, until the ends of the set screws 82 contact the outer surface of the heater body 34 to secure the hot air blower 30, or other heating device, in place.

The second sliding member 16, which adjusts the height of the heating device, may be comprised of have various mechanisms. As depicted in FIG. 1, the second sliding member 16 has a base member 106, a guide pole 108, a slide plate 110, at least one fastening screw 112 and an adjustment mechanism 114. The base member 106 is slidably attached to the first sliding member 14. The first sliding member 14 allows the movement of the base member 106 along the Y-axis. The guide pole 108 extends upwardly along the Z-axis. The slide plate 110 is pierced by the guide pole 108 and moves along the guide pole 108. The fastening screw 112 extends along and aligned with the axis of rotation A and pierces the slide plate 110 and the arm plate 22. The bottom of the fastening screw 112 sticks out from the lower surface of the arm plate 22. A nut 116 is attached to the bottom of the fastening screw 112. The arm plate 22 connecting to the slide plate 110 can turn along the fastening screw 112. The arm plate 22 may be formed of one plate. Alternatively the arm plate 22 is formed of plural plates, though this may lower positioning accuracy.

Figure 6A:
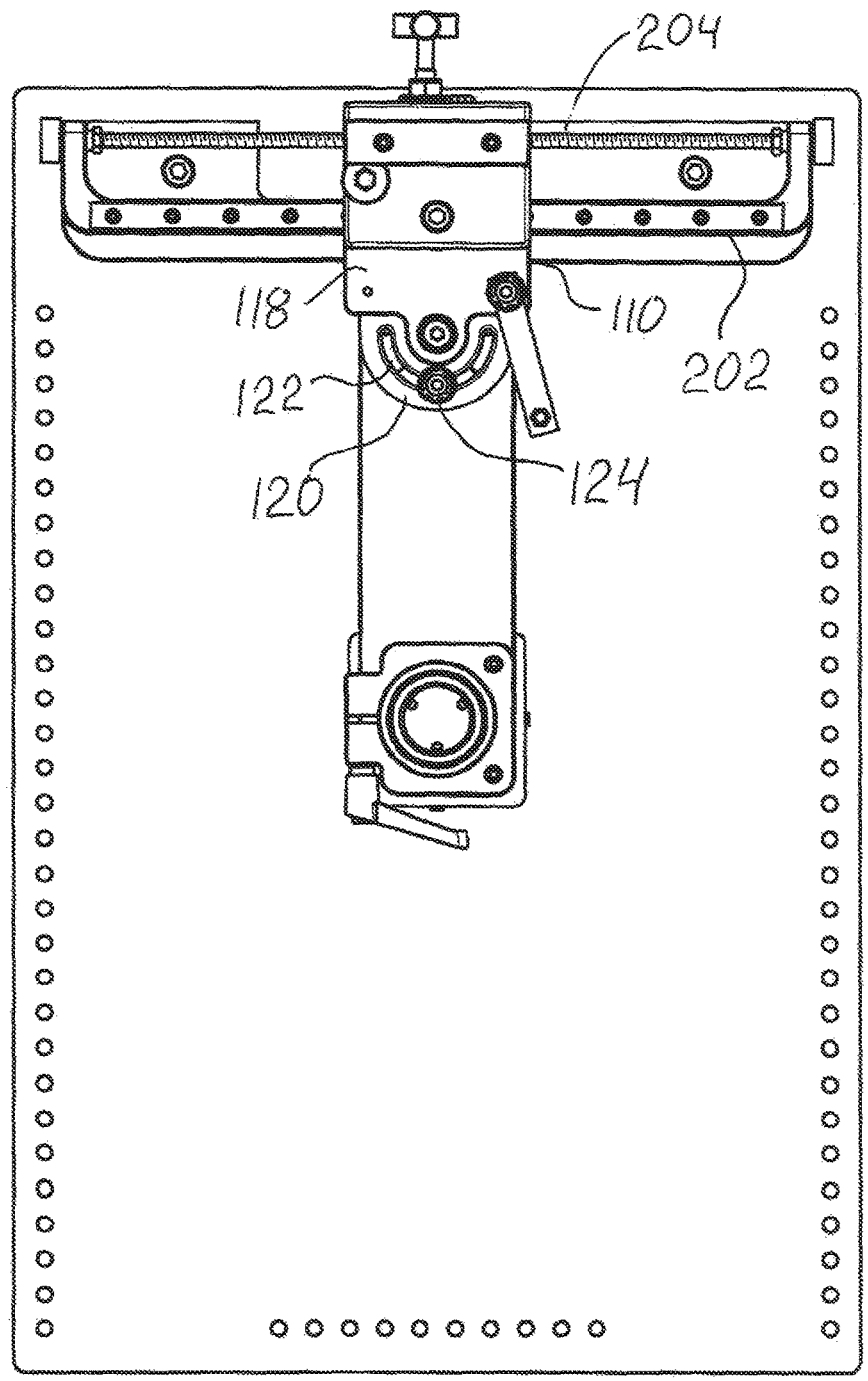
FIG. 6A is a top view of the holding stand of the present invention.
Figure 6B:
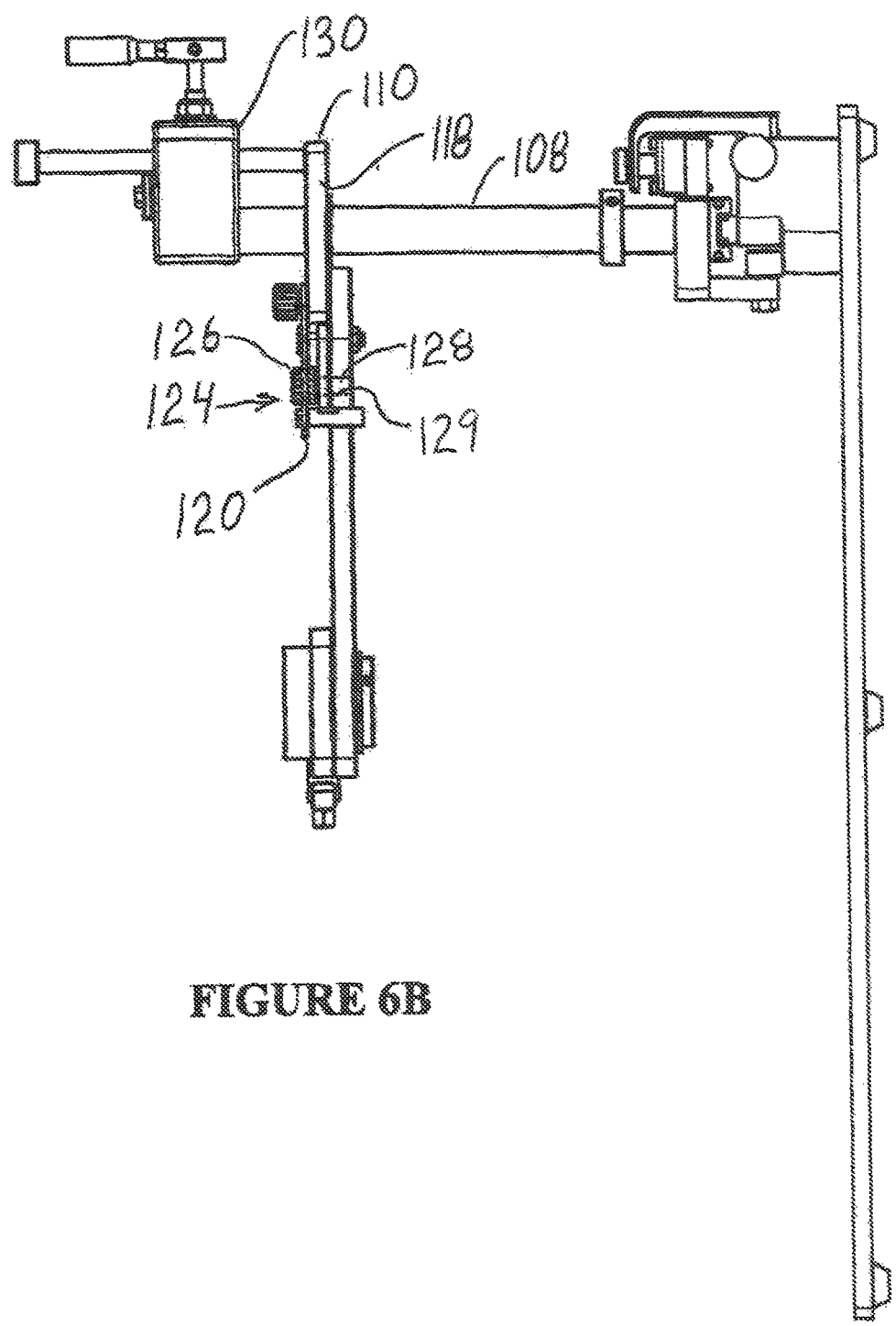
FIG. 6B is a side view of the holding stand of the present invention.

The arm plate 22 rotates relative to the slide plate 110. The holding stand 10 may have a mechanism to fix the arm plate 22 to the slide plate 110. FIG. 6A and FIG. 6B show the holding stand in a top view and side view, respectively. The slide plate 110 preferably includes a thick part 118 and a thin part 120. The thin part 120 is thinner than the thick part 118 and as depicted may have a semicircular shape with a semicircular slot 122. The rotary member 18 has a lock bolt 124. As depicted in FIG. 6B, the lock bolt 124 has a head 126 and a shank 128. As depicted in FIG. 6A, the head 126 has dimensions that are larger than the width of the semicircular slot 122, and thereby when the shank 128 is inserted through the semicircular slot 122 the underside bearing surface of the head 126 rests on the upper side of the thin part 120 of the slide plate 110. The shank 128 is preferably partially threaded. The shank 128 is inserted through the semicircular slot 122 and engages a threaded screw hole 129 in the arm plate 22. The arm plate 22 is positionally fixed on the thin part 120 of the slide plate 110 by the frictional force between the thin part 120 and the arm plate 22.

The slide plate 110 may move up and down along the guide pole 108. The user can use various mechanisms to adjust the height of the slide plate 110. As depicted in FIG. 1, the adjustment mechanism has a gearbox 130, a handle 132, a rack rod 134, a guide rod 136 and a stopper plate 138. The rack rod 134 and the guide rod 136 pierce the gearbox 130 in the vertical direction. The slide plate 110 is attached to the bottom of the rack rod 134 and the guide rod 136. The stopper plate 138 is attached to the top of the rack rod 134 and the guide rod 136. When the user turns a handle 132 the slide plate 110, the rack rod 134, the guide rod 136 and the stopper plate 138 move up or down integrally. When the slide plate 110 reaches an upper limit position, a lower or bottom surface of the gearbox 130 hits the slide plate 110. When the slide plate 110 reaches a lower limit position, an upper or top surface of the gearbox 130 hits the stopper plate 138.

Figure 7:
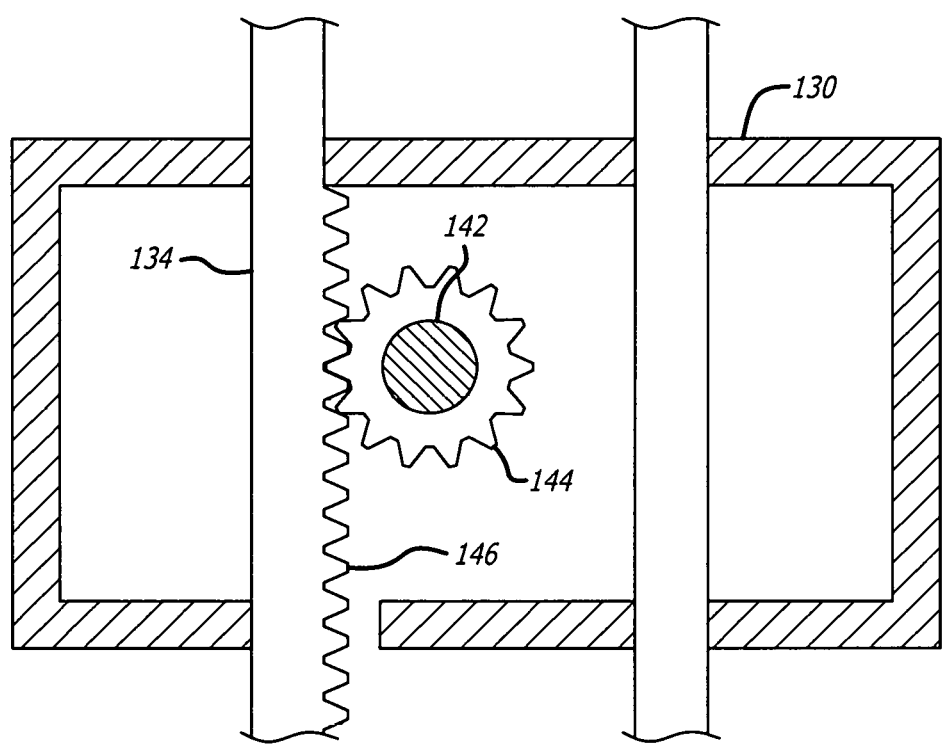
FIG. 7 is a cross sectional view of the gearbox of the holding stand of the present invention.

FIG. 7 provides a cross-sectional drawing of the gearbox 130. The handle 132 of FIG. 1 has an inserting rod 142 and a pinion 144. As depicted in FIG. 7, the pinion 144 is connected to a distal end of the inserting rod 142 in the gearbox 130. Racks 146 are provided in the rack rod 134 and meshed with the pinion 144. When the user turns the pinion 144, using the handle 132, the rack rod 134 moves in the vertical direction.

Figure 8:
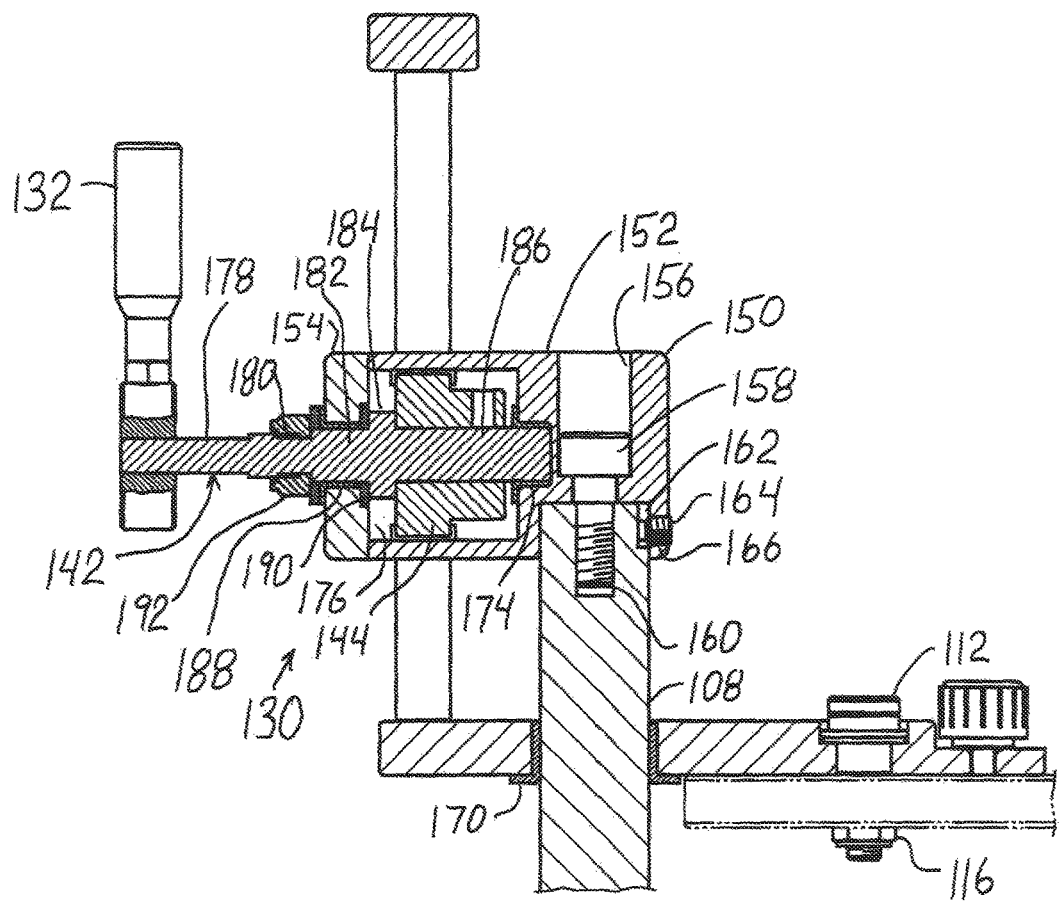
FIG. 8 is a detailed cross sectional view of the gearbox of the holding stand of the present invention.

FIG. 8 is a cross sectional view depicting the gearbox 130. The gearbox 130 has a fixed plate 150, a box 152 and a brake plate 154. The fixed plate 150 has a through-hole 156. A fixing bolt 158 is inserted into the through-hole 156 and screwed into a threaded screw hole 160 of the guide pole 108. The gearbox 130 is connected to the guide pole 108. As depicted in FIG. 8, the guide pole 108 has a key groove 162. A set bolt 164 is screwed into a screw hole 166 of the fixed plate 150 and partially inserted into the key groove 162. As a result, the set bolt 164 prevents the gearbox 130 from rotating along the Y-axis of the guide pole 108.

The second sliding member 16 has a first sliding bearing 170 secured in the slide plate 110. The guide pole 108 passes through the first sliding bearing 170, so that the slide plate 110 moves along the guide pole 108 according to the operation of the handle 132. The second sliding member 16 also has a second sliding bearing 174. The fixed plate 150 has an inner face receiving the second sliding bearing 174. The inner face of the fixed plate 150 and the box 152 form a housing space 176. An edge of the inserting rod 142 is inserted into the second sliding bearing 174.

The inserting rod 142 has a base end part 178, a male screw part 180, an intermediate part 182, a brake ring 184 and a supporting rod 186. The male screw part 180 is disposed between the base end part 178 and the gearbox 130 and as depicted it is slightly thicker than the base end part 178. The intermediate part 182 is depicted as being slightly thicker than the male screw part 180. The brake ring 184 is the thickest portion of the inserting rod 142. The pinion 144 is attached to the supporting rod 186. The second sliding member 16 may also have a third sliding bearing 188, two washers 190 and a brake nut 192. The third sliding bearing 188 is put into a through-hole of the brake plate 154. The intermediate part 182 is inserted into the third sliding bearing 188. One washer 190 is disposed between the intermediate part 182 and the brake ring 184. The other washer 190 is disposed between the intermediate part 182 and the male screw part 180. The third sliding bearing 188 is disposed between the washers 190. The brake nut 192 is screwed onto the male screw part 180. When the brake nut 192 is driven into the brake plate 154, a high frictional force is generated at the boundary of the brake nut 192, the washers 190, the third sliding bearing 188 and the brake plate 154. This prevents the handle 132 from turning due to the weight of the slide plate 110 and the rotary member 18.

The first sliding member 14 may also be comprised of various mechanisms and components. In FIG. 1, the holding stand 10 is depicted with a linear slide mechanism for the first sliding member 14. As depicted in FIG. 1, the first sliding member 14 has a pedestal 200, a rail 202, a male screw rod 204 and a positioning mechanism 206. The rail 202 extends along the Y-axis relative to the support plate 12. A male screw is formed on an outer surface of the male screw rod 204. As depicted in FIG. 6A, the male screw rod 204 and the rail 202 extend in parallel along the Y-axis.

Figure 9A:
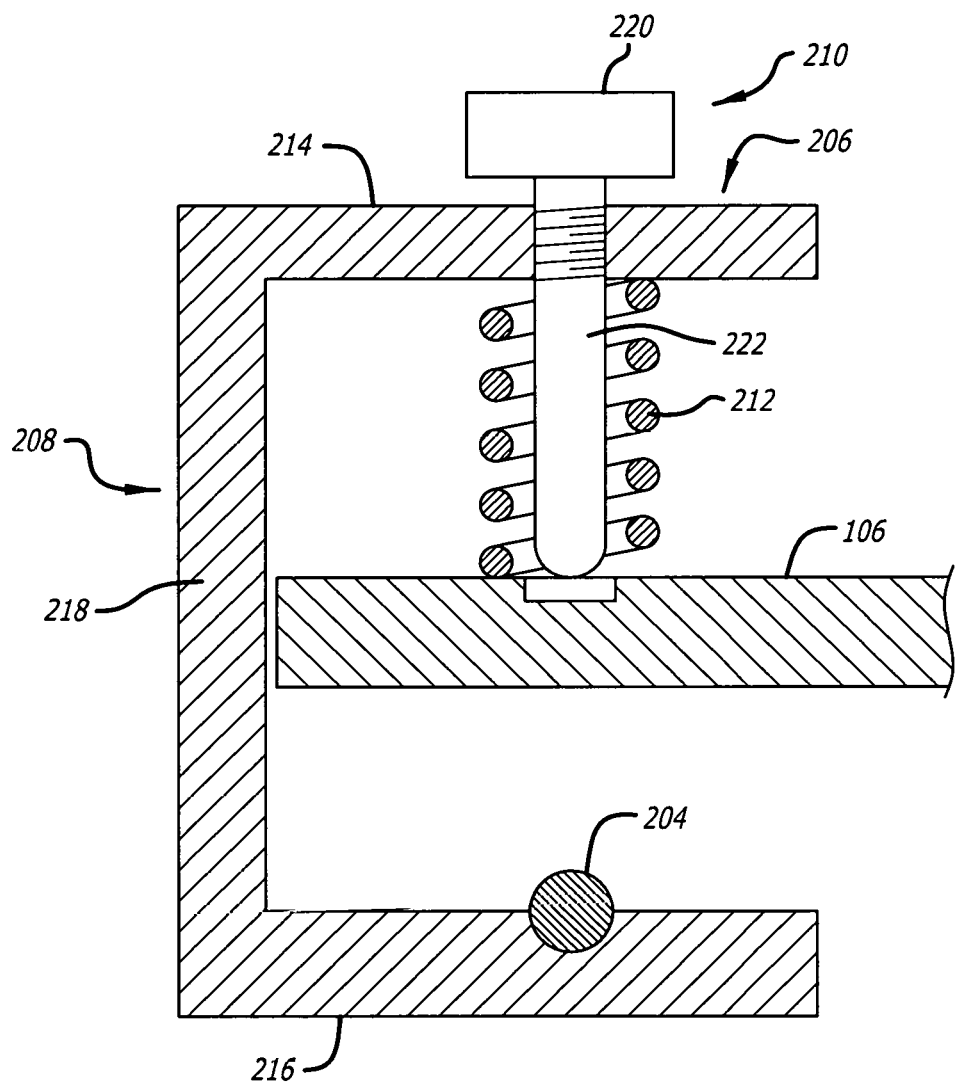
FIG. 9A is a partial cross sectional view of the positioning mechanism of the holding stand of the present invention.
Figure 9B:
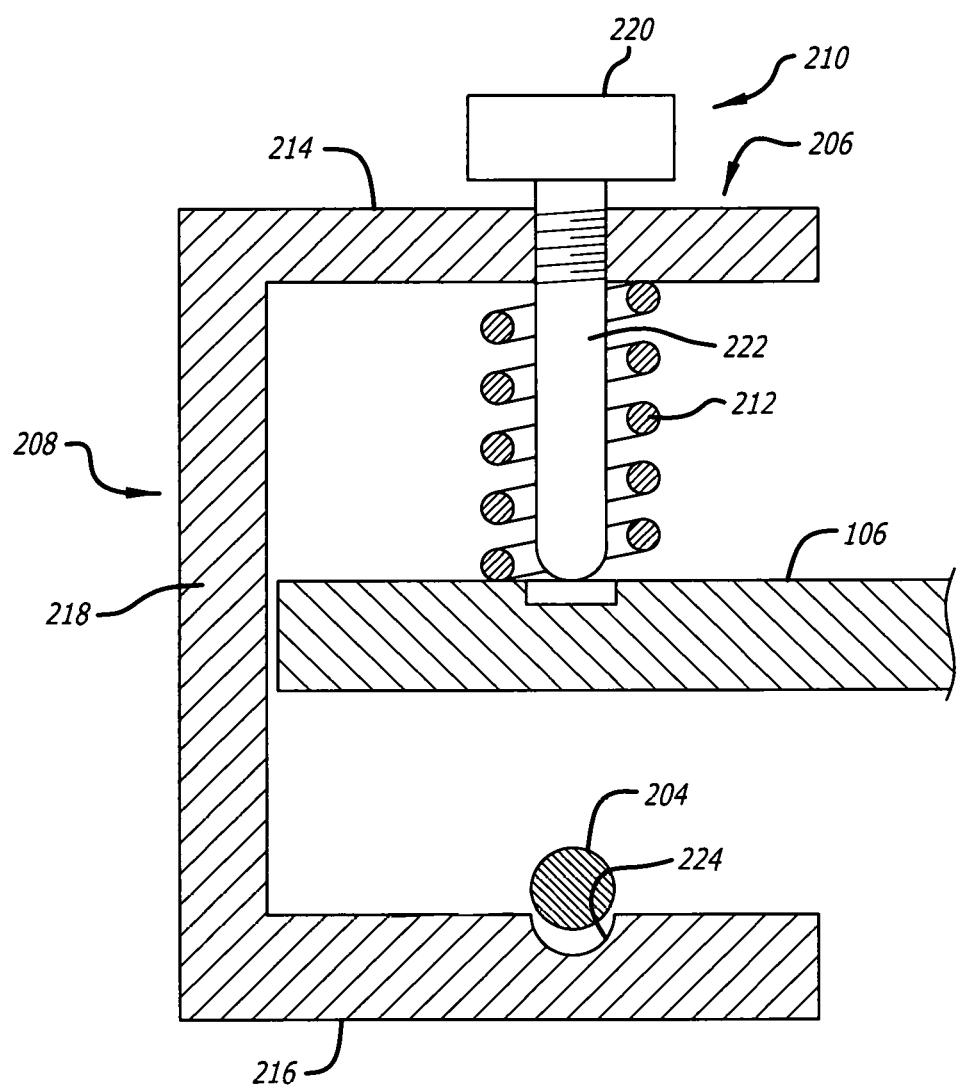
FIG. 9B is a second partial cross sectional view of the positioning mechanism of the holding stand of the present invention.

FIG. 9A and FIG. 9B depict partial cross sectional views of the positioning mechanism 206. The positioning mechanism 206 has a position member 208, an operating pin 210 and a coil spring 212. The position member 208 has an upper plate 214, a lower plate 216 and a vertical plate 218. The upper plate 214 has a lower surface disposed facing an upper surface of the base member 106. The coil spring 212 is located between the lower surface of the upper plate 214 and the upper surface of the base member 106. The operating pin 210 has a pin head 220 and a pin shank 222. A lower end of the pin shank 222 may be inserted into a recess of the base member 106. The pin shank 222 is screwed into a screw hole of the upper plate 214. The operating pin 210 and position member 208 move together. When the user turns the pin head 220, the user can lock the movement of the upper plate 214, the lower plate 216 and the vertical plate 218. As depicted in FIG. 9B, when the user applies the downward force to the upper plate 214 or the pin head 220 of the operating pin 210, the coil spring 212 is compressed and the distance between a lower surface of the upper plate 214 and an upper surface of the base member 106 decreases.

As depicted in FIG. 9A, the coil spring 212 is extended upward without downward force, so that the distance between the lower surface of the upper plate 214 and an upper surface of the base member 106 becomes greater. The lower plate 216 has an upper surface oppositely disposed to the male screw rod 204. As depicted in FIG. 9B, the upper surface of the lower plate 216 has a male screw groove 224. The upper plate 214 and the lower plate 216 are connected by the vertical plate 218. The lower plate 216 moves up and down together with the upper plate 214. When the user does not push the operating pin 210, the male screw groove 224 is meshed with the male screw rod 204 by the urging force of the coil spring 212. As a result, the base member 106 is fixed in place along the Y-axis. When the user pushes the operating pin 210 compressing the coil spring 212, the position member 208 moves so that the male screw groove 224 in the lower plate 216 of the position member 208 moves away from the male screw rod 204, allowing the user to move the base member 106 along the rail 202 in either direction, allowing the position member 206 to be repositioned on the male screw rod 204. When the user releases pressure on the operating pin 210 (or the upper plate 214) the male screw groove 224 in the lower plate 216 re-engages the screw rod 204, to fix the position of the assembly. The screw rod 204 may include a fine adjustment knob 226 (FIG. 1) to allow the user to make precise adjustments of the position along the Y-axis. With this configuration, the user can move and precisely locate the base member 106 along the Y-axis.

The holding stand 10 of the present invention as depicted in FIG. 1 has a linear bearing system first sliding member 14 mounted on one edge of the support plate 12 or work area allowing translation along the Y-axis of the workspace and a second sliding member 16 mounted on a guide pole extending vertically above the first sliding member 14 along the Z-axis relative to the workspace. The second sliding member 16 includes the pivotally mounted arm plate that extends to a rotary member bracket for securing a heating device. The second sliding member 16 includes a mechanism to allow the rotary translation of the arm plate and the rotary member bracket allowing the heating device to be positioned at any X-Y coordinate over the support plate 12. This configuration, combined with the function of the rotary member 18 which allows the heating device to be rotated 360° and secured at any angular orientation, allows precise control over the positioning of the heating device over various shaped electrical components placed in the workspace. The assembly further allows movement in the Z-axis direction away from and toward the work item on the support plate 12. The configuration of the system is thus particularly adapted for allowing a user to quickly and precisely solder or de-soldering an electrical component positioned at the same location of multiple circuit boards.

Those skilled in the art will readily appreciate that the disclosure herein is meant to be exemplary and actual parameters, shapes and materials depend upon the specific application for which the present invention is intended. The foregoing embodiments are presented by way of example while the scope of the invention is intended to be defined by the appended claims and equivalents thereto.

The invention claimed is:

1. A holding stand for a heating device, said holding stand comprising:
    a rotary member for securing the heating device; and
    an assembly for moving and positioning the rotary member in any of three directional axis, said assembly including a linear horizontal sliding member, a linear vertical sliding member attached to said horizontal sliding member, and said rotary member including an arm plate rotationally attached to said vertical sliding member on one end and the opposite end of said arm plate secured to a tool holder.

2. The holding stand of claim 1, wherein said holding stand further comprises a support plate.

3. The holding stand of claim 1, wherein said tool holder further comprises a bearing for securing the heating device.

4. A holding stand for a heating device, said holding stand comprising:
    a rotary member for securing the heating device;
    an assembly for moving and positioning the rotary member in any of three directional axis, said assembly including a linear horizontal sliding member, a linear vertical sliding member attached to said horizontal sliding member, and said rotary member including an arm plate rotationally attached to said vertical sliding member on one end and an opposite end of said arm plate secured to a tool holder; and
    wherein said tool holder further comprises a bearing for securing said heating tool and a lock mechanism to fix the rotational position of said tool holder within said bearing, said lock mechanism has a ring piece, an operation lever and fixation elements.

5. A holding stand for a heating device, said holding stand comprising:
    a rotary member for securing the heating device; and
    an assembly for moving and positioning the rotary member in any of three directional axis, said assembly including a linear horizontal sliding member, a linear vertical sliding member attached to said horizontal sliding member, and said rotary member including an arm plate rotationally attached to said vertical sliding member on one end and securing a tool holder on an opposite end wherein said linear horizontal sliding member further comprises: a pedestal, a rail on said pedestal, a male screw extending parallel to said rail, and a positioning mechanism having a position member user selectively engaging said male screw whereby a user may disengage said position member from said male screw and slide said positioning mechanism and base member horizontally on said rail to a different position.

6. The holding stand of claim 5, wherein said pedestal is attached to a support plate.

7. The holding stand of claim 5, wherein said positioning mechanism has a position member including an upper plate, a lower plate and a vertical plate extending therebetween, said positioning mechanism further including an operating pin and a coil spring surrounding a portion of said operating pin and bound by said upper plate and a base member.

8. The holding stand of claim 5, wherein said linear vertical sliding member further comprises: a guide pole attached to and extending vertically from said base member, a slide plate positioned around said guide pole and an adjustment mechanism attached to the vertical end of said guide pole, said adjustment mechanism configured to vertically reposition said slide plate on said guide pole.

9. The holding stand of claim 5, wherein said base member can be secured as against movement on said rail of said linear horizontal sliding member.

10. The holding stand of claim 8, wherein said adjustment mechanism further comprises a gearbox, a rack rod and a guide rod aligned in parallel and extending through said gearbox, and a stopper plate affixed to top ends of said rack rod and guide rod with said slide plate being attached to bottom ends of said rack rod and guide rod.

11. The holding stand of claim 10, further comprising a handle having an inserting rod and a pinion, said pinion connected to a distal end of the inserting rod inside of said gearbox, said pinion configured to engage racks provided on said rack rod whereby turning said pinion using said handle causes said rack rod, guide rod, stopper plate and slide plate to move in the vertical direction.

12. The holding stand of claim 1 wherein said arm plate of said rotary member is pivotally secured to a slide plate of said vertically sliding member.

13. A holding stand for a heating device comprising:
    a rotary member for securing the heating device; and
    an assembly for moving and positioning the rotary member in any of three directional axis, said assembly including a linear horizontal sliding member, a linear vertical sliding member attached to said horizontal sliding member, and said rotary member including an arm plate rotationally attached to said vertical sliding member on one end and securing a tool holder on an opposite end wherein said arm plate of said rotary member is pivotally secured to a slide plate of said vertically sliding member with a lock bolt having a shank inserted through a semicircular slot in said slide plate and a hole in said arm plate.

14. The holding stand of claim 13 wherein said arm plate is a single flat metal piece.

15. A holding stand for a heating device, said holding stand comprising:
    a rotary member for securing the heating device, said rotary member including an arm plate rotationally attached to a vertical sliding member on one end and securing a tool holder on an opposite end, said tool holder including a bearing and a lock mechanism to fix the position of said tool holder within said bearing, said lock mechanism has a ring piece, an operation lever and fixation elements;
    an assembly for moving and positioning said rotary member in any of three directional axis, said assembly including:

a linear horizontal sliding member comprising a pedestal, a rail on said pedestal, a male screw extending parallel to said rail, and a positioning mechanism having a position member user selectively engaging said male screw whereby a user may disengage said position member from said male screw and slide said positioning mechanism and base member horizontally on said rail to a different position; and the vertical sliding member attached to said arm plate of said rotary member, said vertical sliding member mounted on said horizontal sliding member, said linear vertical sliding member comprising a guide pole attached to and extending vertically from said base member, a slide plate positioned around said guide pole and an adjustment mechanism attached to the vertical end of said guide pole, said adjustment mechanism configured to vertically reposition said slide plate on said guide pole.

* * * * *